United States Patent [19]
Hosten

[11] Patent Number: 5,827,410
[45] Date of Patent: Oct. 27, 1998

[54] DEVICE FOR THE ELECTROLYTIC TREATMENT OF PLATE-SHAPED WORKPIECES

[75] Inventor: Daniel Hosten, Handzame, Belgium

[73] Assignee: Siemens S.A., Bruxelles, Belgium

[21] Appl. No.: 836,625

[22] PCT Filed: Nov. 14, 1995

[86] PCT No.: PCT/EP95/04473

§ 371 Date: May 15, 1997

§ 102(e) Date: May 15, 1997

[87] PCT Pub. No.: WO96/15294

PCT Pub. Date: May 23, 1996

[30] Foreign Application Priority Data

Nov. 15, 1994 [DE] Germany .................. 44 40 849.8

[51] Int. Cl.[6] .................................................. C25D 17/00
[52] U.S. Cl. .................. 204/198; 204/237; 204/275; 204/277
[58] Field of Search .................. 204/198, 237, 204/269, 270, 277

[56] References Cited

U.S. PATENT DOCUMENTS

| | | | |
|---|---|---|---|
| 4,155,815 | 5/1979 | Francis et al. .................. 204/198 X |
| 4,372,825 | 2/1983 | Eidschun . | |
| 4,401,522 | 8/1983 | Buschow et al. . | |
| 4,883,575 | 11/1989 | Yasuno et al. .................. 204/198 |
| 4,986,888 | 1/1991 | Hosten et al. .................. 204/198 |

FOREIGN PATENT DOCUMENTS

| | | |
|---|---|---|
| 0 421 127 A1 | 4/1991 | European Pat. Off. . |
| 2 103 248 | 2/1983 | United Kingdom . |

OTHER PUBLICATIONS

Patent Abstracts of Japan (C–283 May 30, 1985 Vol. 9/No. 125); JP 60–13096 (A); Jan. 23, 1985; pp. 511–514.

*Primary Examiner*—Donald R. Valentine
*Attorney, Agent, or Firm*—Hill & Simpson

[57] ABSTRACT

The plate-shaped workpieces (W) are conducted through a treatment cell (BZ) containing a treatment bath in vertical attitude on a horizontal conveying path with the assistance of contacting and conveying means, the end walls of said treatment cell having vertical slots for the passage of the workpieces (W). The bath liquid emerging from the treatment (BZ) is collected in a collecting tank and is returned such into the treatment cell (BZ) with the assistance of a pump that an at least largely vertical flow direction (SR) derives at both sides of the conveying path. The bath liquid is diverted toward the surface of the workpieces (W) with guide devices (LV) arranged at both sides of the convoying path in the treatment cell (BZ). An improved ion exchange in the region of the workpieces (W) is effected by the guide devices (LV). In, for example, the electrolytic treatment of printed circuit boards, the metal deposition can thus be undertaken with high current densities. The guide devices (LV) are thereby arranged such that they form a guide for the workpieces. As a result thereof, thin, flexible printed circuit boards can also be particularly treated. The guidance of workpieces (W) with different formats and heights likewise presents no difficulties.

16 Claims, 2 Drawing Sheets

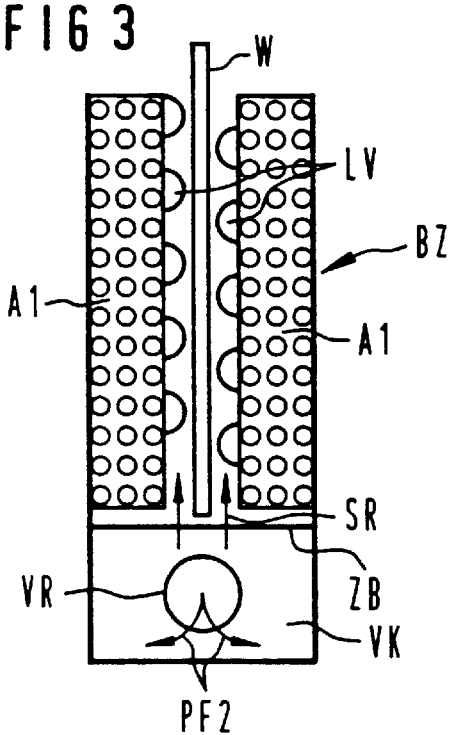
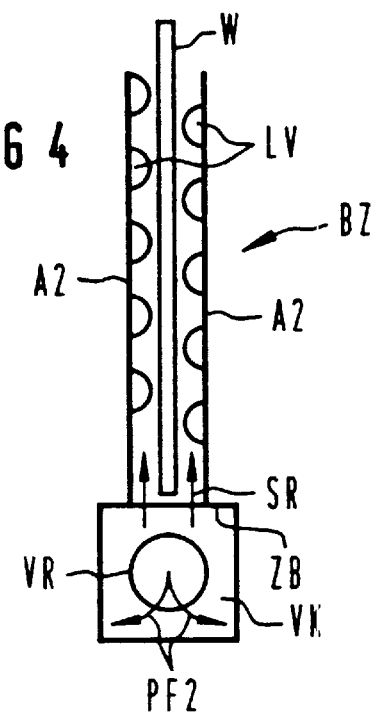
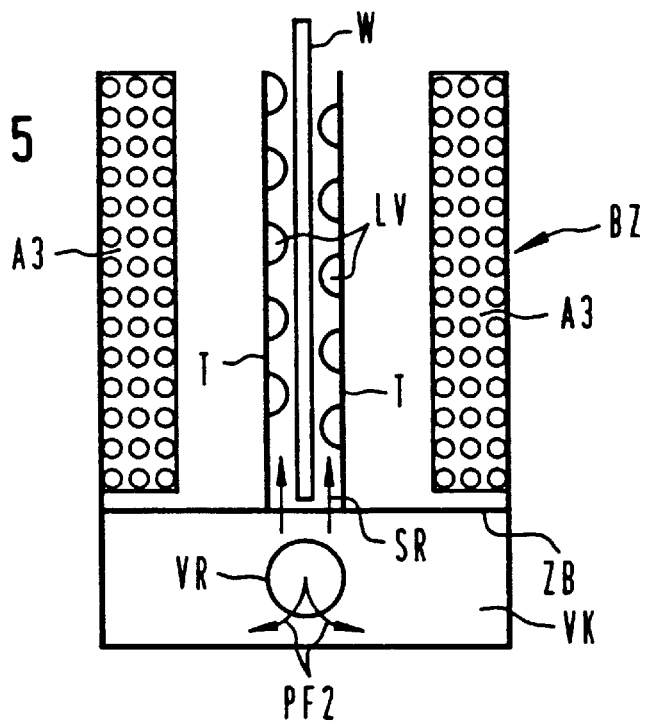

DEVICE FOR THE ELECTROLYTIC TREATMENT OF PLATE-SHAPED WORKPIECES

BACKGROUND OF THE INVENTION

The present invention generally relates to methods and apparatus for electrolytically treating workpieces. More particularly, it relates to a new and improved apparatus for electrolytic treatment of planar workpieces, such as printed circuit boards, wherein the workpieces are conveyed in an upright verticle orientation through a treatment cell and a verticle flow of bath liquid in the treatment cell is redirected toward the major surfaces of the planar workpieces for improved ion exchange.

EP-A-0 421 127 discloses an apparatus for treating printed circuit boards wherein the individual printed circuit boards are continuously conducted through successively arranged treatment baths in vertically suspended attitude on a horizontal conveying path. The conveying of the printed circuit boards through the treatment baths accommodated in treatment cells ensues via clamps arranged at endlessly circulating drives, these clamps also simultaneously assuming the cathodic contacting of the printed circuit boards in the case of an electrodeposition. Vertical slots for the passage of the printed circuit boards are located in the end walls of the treatment cells, whereby seals fashioned as brush seals or strip brush seals are provided in the passage region. The individual treatment cells are arranged in collecting tanks from which the collected bath liquid is continuously returned into the allocated treatment cells with the assistance of appropriate pumps. The return of bath liquid into a treatment cell thereby ensues via an admission connected to the appertaining pump at the pressure side whose opening lies in an end wall under the vertical slot for the passage of the printed circuit boards and is horizontally directed into the treatment cell. The bath liquid that flows in should thereby be uniformly distributed onto both sides of the printed circuit boards.

US-A-4,401,522 discloses a similarly constructed apparatus for the electrolytic treatment of workpieces such as, for example, printed circuit boards, wherein vertically arranged roller pairs are allocated as seals to the vertical slots in the end walls of the treatment cells. The return of bath liquid into a treatment cell here ensues via two rows of vertically directed spray types arranged at both sides of the conveying path that are each respectively provided with a series of spray openings in longitudinal direction that are directed onto the workpieces. The supply of the spray pipes ensues via a distribution chamber fashioned in the floor region of the treatment cell that is in turn supplied with bath solution from the collecting tank via the pump.

JP 60-13096 A (in Patents Abstracts of Japan, C-283, Vol. 9/No. 125) discloses an apparatus for the electroylytic treatment of printed circuit boards that comprises a treatment cell for the acceptance of the treatment bath, two insoluble anodes arranged at a spacing from one another in the treatment cell, and a pump for the circulation of the bath liquid. The cathodically contacted printed circuit boards are suspended centrally from above between the two anodes, whereby the bath liquid circulated with the pump is introduced into the treatment cell from above at both sides of the printed circuit board. Ladder-shaped inserts with horizontally proceeding rails are additionally suspended into the treatment cell at both sides of the printed circuit board, whereby the inserts are moved parallel to the plane of the printed circuit board and thereby increase the turbulence of the bath liquid flowing from top to bottom at both sides of the printed circuit board.

SUMMARY OF THE INVENTION

The present invention provides a new and improved apparatus for the electrolytic treatment of vertically aligned, plate-shaped workpieces wherein the workpiece surfaces are effectively contacted with bath liquid to provide an improved ion exchange at the workpiece surfaces, as the workpieces are conveyed through treatment cells.

More particularly, in an embodiment, a new and improved apparatus for electrolytic treatment of a planar substrate, such as a printed circuit substrate, is provided. The apparatus comprises a treatment cell including at least one upstanding peripheral sidewall defining a cell body having an interior bath cavity. In a preferred embodiment, the treatment cell comprises a generally rectangular upstanding cell body including a pair of opposed sidewalls interconnected by a pair of opposed end walls. The bath cavity includes a floor or bottom wall or end and an opposed open top end. A pair of aligned and opposing vertical slots are defined in the peripheral sidewall, and preferably in the opposed end walls. The aligned slots define a conveying axis extending through the treatment cell.

A plurality of upstanding spaced apart guide members are disposed in the bath cavity adjacent the conveying axis on opposite sides thereof. The guide members are positioned so as to define a plate guide path along the conveying axis. In a preferred embodiment, a pair of linear arrays of spaced apart guide members are provided on each side of the conveying axis and the guide members of one linear array may be aligned with or staggered with respect to the guide members in the linear array provided on the opposite side of the conveying axis. Each guide member includes a surface portion facing the conveying axis having a plurality of surface projections. Each surface projection has a surface configuration which is effective to redirect a flow of bath liquid flowing from the bottom end to the top end of the bath cavity to a new flow direction including a flow component directed toward the conveying axis and therefore to a planar workpiece being conveyed therealong.

A pair of electrodes having a first polarity are disposed in the bath cavity on opposite sides of the conveying axis. These electrodes may comprise anodes or cathodes depending on the overall electrolytic treatment being performed.

Preferably, the treatment cell is disposed within, or is bounded or surrounded by an outer collecting tank. The collecting tank collects bath liquid spilling over or otherwise issuing from the treatment cell. A conduit fluidly connects the bottom of the collecting tank with the bottom end of the bath cavity. A pump is provided along the conduit to provide a continuous return of bath liquid from the collecting tank to the bath cavity. A flow director is provided in the bottom end of the bath cavity which is effective to direct the flow of returning bath liquid through the bath cavity from the bottom end to the top and so that substantially vertical flow of bath fluid is provided at both sides of the conveying axis.

The apparatus further comprises a conveyor which contacts a planar substrate to be electrolytically treated with a second polarity opposite the first polarity of the bath electrodes. The conveyor conveys the gripped and contacted workpiece through the treatment cell along the conveying axis.

The advantages achieved with the invention include that the bath liquid returned into the treatment cell with a vertical flow direction can be diverted onto the surface of the workpieces with little outlay on the basis of guide mechanisms installed in the treatment cell. Compared to the installation of vertically aligned spray pipes in the treatment cell, the accommodation of guide devices at both sides of the conveying path requires only little outlay. As a result of the ion exchange improved with the flooding of the workpieces, the current densities of the electrolytic treatment can be substantially boosted. In the surface-wide electrodeposition of copper onto printed circuit boards, for example, current densities of up to 10 A/dm$^2$ were capable of being realized without problems. The guide devices thereby simultaneously serve as guide for the plate-shaped workpieces, so that other measures for the guidance of the workpieces through the treatment cells can be eliminated. As a result of the guide properties of the guide devices, thin, flexible printed circuit boards can also particularly be treated in through-put. Moreover, workpieces having various formats and heights can be conducted through the treatment cells.

In an embodiment, bath liquid is returned from the collection tank to the treatment cell through the floor of the treatment cell which enables a flow of the bath liquid directed from bottom to top at both sides of the conveying path with little outlay. In an embodiment, the return of bath liquid can thereby be undertaken in an especially simple way via a distribution chamber formed in the floor region of the treatment cell.

In an embodiment, a distribution pipe for the bath liquid extends in the distribution chamber along the conveying axis which is connected to a pump at the pressure side so that, the distribution of the bath fluid returned into the treatment cell is made even more uniform.

In an embodiment, a flow of air is also introduced through the floor of the treatment cell into the bath cavity which leads to an increase in the turbulence of the bath liquid flowing at both sides of the workpieces.

In an embodiment, the guide members on opposite sides of the conveying path are staggered with respect to each other along the conveying axis so that bath fluid is floodingly directed alternately from both sides of the workpiece, so that the holes of perforated printed circuit boards are flooded in an especially good way.

In an embodiment, the surface projections on the guide members are provided with a surface configuration or profile which includes an underside surface which is ramped or inclined toward the conveying axis. This embodiment provides for redirection of the flow of the bath liquid with especially small outlay. In a preferred embodiment, the slope of the ramp or inclined surfaces is from about 5 to about 15° relative to the horizontal to prevent a stripe-shaped covering of the workpieces.

In an embodiment, the guide devices can be attached in an especially simple way to those sides of the electrodes facing toward the workpieces. Moreover, the guide devices in the case of an electrodeposition can be attached to soluble or to insoluble anodes.

In an embodiment, the surface projections can also be attached to carriers that are arranged between the workpieces and the soluble anodes. A further enhancement of the electrolyte motion at the cathode can be achieved with this arrangement. Moreover, an improved distribution of layer thicknesses given great aspect ratios can be achieved by a greater spacing between anodes and cathode. According to claim 14, the carriers can thereby be fashioned as porous plates. Alternatively, the carriers can be formed by frames over which transmissive cloth or fleece is stretched. In both instances, an extremely efficient electrolyte movement can be realized between the carriers and the workpieces.

Exemplary embodiments of the invention are shown in the drawing and are described in greater detail below.

BRIEF DESCRIPTION OF THE DRAWINGS

FIG. 3—a cross-section through a first embodiment of the treatment cell of an apparatus according to FIGS. 1 and 2;

FIG. 4—a cross-section through a second embodiment of the treatment cell of an apparatus according to FIGS. 1 and 2; and FIG. 5—a cross-section through a third embodiment of the treatment cell of an apparatus according to FIGS. 1 and 2.

DETAILED DESCRIPTION OF THE PREFERRED EMBODIMENT

Figure 1:
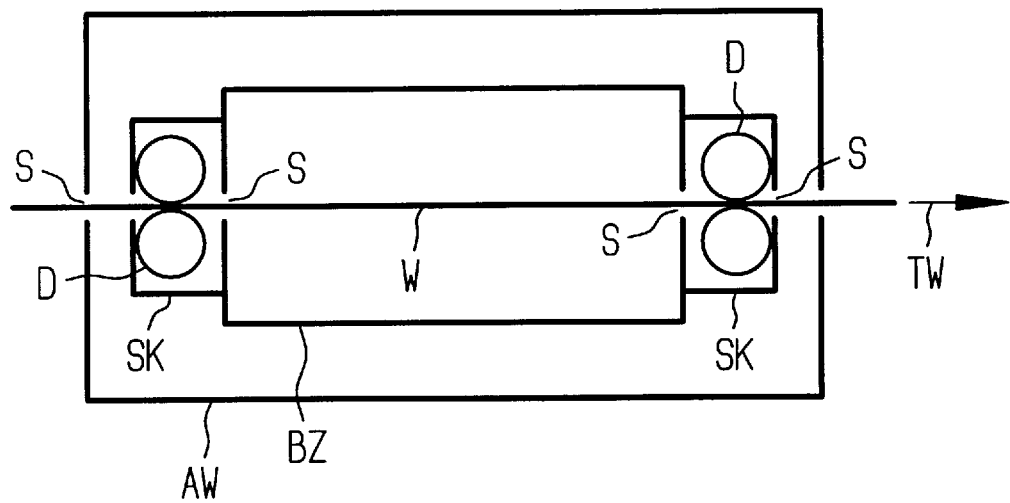
FIG. 1 and FIG. 2—a highly simplified, schematic illustration of an apparatus for electrolytic treatment of plate-shaped workpieces in plan view and, respectively, in cross-section.
Figure 2:
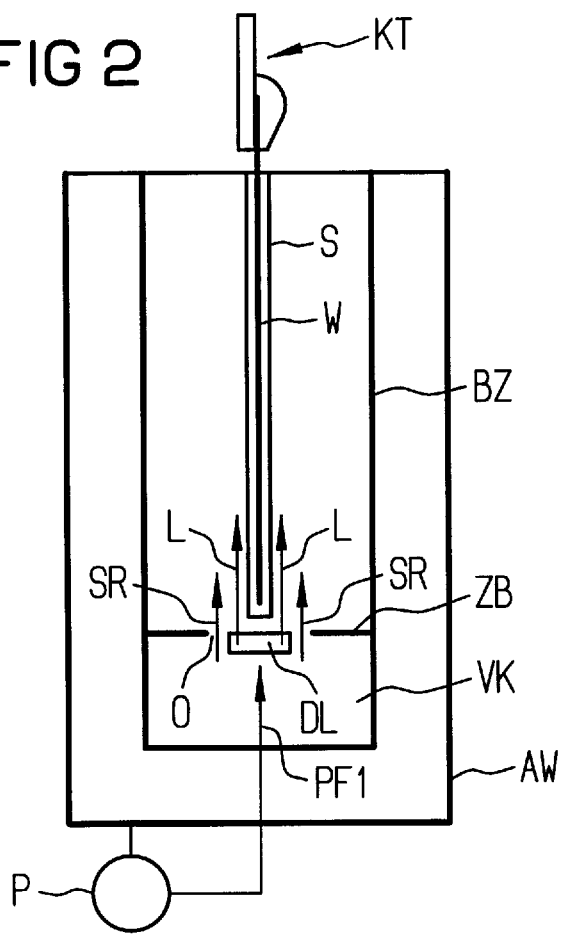

In plan view and, respectively, in cross-section, FIGS. 1 and 2 show a treatment cell BZ that contains an electrolytic treatment bath and is arranged in a collecting tank AW and through which plate-shaped workpieces W vertically suspended at contacting and conveyor means KT are conducted through on a horizontal conveying path TW. Sluice chambers SK in which seals D formed by circular-cylindrical plastic pipes are loosely arranged in pairs and in vertical alignment are located at both end walls of the treatment cell BZ. The seals D are thereby pressed against one another or against the respectively traversing workpiece W by the pressure of the bath liquid. The end walls of the treatment cells BZ, of the sluice chambers SK and of the collecting tank AW are provided with vertical slots S through which the plate-shaped workpieces W can be conducted unimpeded. The bath liquid emerging from the treatment cell BZ in the region of the sluice chambers SK and also potentially overflowing over the walls of the treatment cell BZ is collected in the collecting tank AW and is continuously returned into the treatment cell BZ via a pump P, as indicated by an arrow PF1 in FIG. 2.

Electrodes (not shown in FIGS. 1 and 2) that exhibits the opposite polarity of the contacting and conveying means KT are arranged in the treatment cell BZ at both sides of the conveying TW. In the case of an electrodeposition onto the workpieces W, these are cathodically contacted via the contacting and conveying means KT, whereas the electrodes yet to be explained in greater detail with reference to FIGS. 3–5 are a matter of anodes.

The afore-mentioned return of bath liquid into the treatment cell BZ indicated in FIG. 2 by the arrow PF1 ensues via a distribution chamber VK. This distribution chamber VK formed by a false floor ZB in the floor region of the treatment cell BZ is provided with two rows of openings O that are introduced into the false floor ZB at both sides of the conveying path TW. The bath liquid conveyed from the pump P into the distribution chamber VK with a vertical flow direction can then flow up through these openings O at both sides of the workpieces W, as indicated by the arrows SR in FIG. 2. The upwardly flowing bath liquid is then diverted toward the surface of the workpieces W by guide devices that are not shown in FIGS. 1 and 2. In order to increase the turbulence of the upwardly flowing bath liquid, air is introduced into the treatment cell BZ at both sides of the workpieces W via a compressed air conduit DL, as indicated by arrows L in FIG. 2. Various responsibilities for the fashioning of the treatment tanks BZ and for the arrangement of the guide devices in the treatment cells BZ are explained in greater detail below with reference to FIGS. 3–5.

FIG. 3 shows a first embodiment of a treatment cell BZ with electrodes that are a matter of soluble anodes A1 arranged at both sides of the conveying path TW (see FIG. 1) of the workpieces W. In the case of an electrodeposition of copper, the soluble anodes A1 are composed, for example, of titanium baskets and of copper balls accommodated therein. Guide devices LV that are formed by semicircular profiles arranged at a vertical spacing from one another and respectively inclined by an angle of 10° relative to the horizontal are attached to those sides of the soluble anodes A1 facing toward the workpieces W. As viewed in vertical direction, the guide devices LV composed, for example, of high-molecular PE are arranged in alternation at both sides of the workpieces W, i.e. each guide device LV of one side is located at exactly half the height between two guide devices LV of the opposite side. Moreover, the spacing between the guide devices LV of both sides is dimensioned such that a guidance for the traversing, plate-shaped workpieces W is formed.

A horizontally directed distribution pipe VR which is connected to the pump P (see FIG. 2) at the pressure side is located in the floor region of the treatment cell BZ in the distribution chamber VK formed by the false floor ZB. At its underside, this distribution pipe VR is provided with holes arranged spaced from one another from which the bath liquid emerges, as indicated by the arrows PF2 in FIG. 3. As was already explained in conjunction with FIG. 2, the bath liquid then flows with a vertical flow direction SR upward at both sides of the traversing workpieces W and into the treatment cell BZ. The upwardly flowing bath liquid is then repeatedly diverted to the surface of the workpieces W by the guide devices LV. Overall, a meander-shaped flow with a horizontal flow component respectively directed onto the surface of the workpieces W in the region of the guide device LV respectively arises at both sides of the workpieces W. As a result of the alternating arrangement of the guide device LV, the via holes given perforated printed circuit boards have an extremely good flow through them in the treatment.

FIG. 4 shows a second embodiment of the treatment cell BZ wherein the guide devices LV are attached to the insides of soluble anodes A2 facing toward one another. At the same time, the insoluble anodes A2 formed, for example, of platinum-coated titanium plates form the side walls of the treatment cell BZ. Moreover, the flow course of the bath liquid described with reference to FIG. 3 occurs.

FIG. 5 shows a third embodiment of a treatment cell BZ with electrodes arranged at both sides of the conveying path TW (see FIG. 1) of the workpieces W, these electrodes here being a matter of soluble of anodes A3. The carrier T to whose insides facing toward one another the guide devices LV are attached are located between the soluble anodes A3 and the traversing workpieces W. These carriers T are composed, for example, of porous plates that are transmissive for the bath liquid or of titanium frames over which transmissive PE cloth is stretched. The carriers T extending parallel to the soluble anodes A3 form a type of inside cell within the treatment cell BZ in which the same flow course of the bath liquid as in the embodiments of FIG. 3 and of FIG. 4 derives.

Given the third embodiment shown in FIG. 5, only the bath liquid returned into the region between the carriers T need be conducted via a filter with the assistance of a relatively small pump. A part of the overall bath liquid returned can be introduced unfiltered into the regions between the carriers T and the soluble anodes A3.

What is claimed is:

1. Apparatus for the electrolytic treatment of plate-shaped workpieces (W), particular of printed circuit boards, comprising:

contacting and conveying means (KT) that are adapted for anodically or cathodically contacting the workpieces (W) through at least one treatment bath;

a treatment cell (BZ) for the acceptance of the treatment bath, electrodes adapted to have an opposite polarity than the contacting and conveying means (KT) and arranged at both sides of the conveying path (TW) in the treatment cells (BZ), vertical slots (S) in the end walls of the treatment cell for the passage of the workpieces (W), a collecting tank (AW) for the bath liquid emerging from the treatment cell (BZ), and with at least one pump (P) for the continuous return of bath liquid from the collecting tank (AW) into the treatment cell (BZ), characterized by means for returning bath liquid into the treatment cell (BZ) at both sides of the conveying path (TW) within an at least largely vertical flow direction (SR); and by guide devices (LV) arranged at both sides of the conveying path (TW) in the tretreatment cell (BZ), said guide devices adapted for diverting bath liquid toward a surface of the workpieces (W), wherein the guide devices (LV) are arranged such that they may form a guide for the workpieces (W).

2. Apparatus according to claim 1, wherein said means for returning bath liqliquid into the treatment cell (BZ) introduces bath liquid at least partially in the floor region of the tretreatment cell (BZ).

3. Apparatus according to claim 2, wherein said means for returning bath liquid into the treatment cell (BZ) introduces bath liquid via a distribution chamber (VK) formed in the floor region thereof and via openings (O) of the distribution chamber (VK) arranged at both sides of the conveying path (TW).

4. Apparatus according to claim 3, characterized by a distribution pipe (VR) for bath liquid that extends in the distribution chamber (VK) in the direction of the conveying path (TW) and is connected to the pump (P) at the pressure side.

5. Apparatus according to claim 1 characterized in that means for the introduction of air (L) are arranged in the floor region of the treatment cell (BZ).

6. Apparatus according to claim 1, characterized in that the guide devices (LV) are arranged in alternation at both sides of the conveying path (TW) as viewed in vertical direction.

7. Apparatus according to claim 1, characterized in that the guide devices (LV) are formed by profiles that extend in the direction of the conveying path (TW) and are inclined relative to the horizontal.

8. Apparatus according to claim 7, characterized in that the profiles are inclined by 5 to 15° relative to the horizontal.

9. Apparatus according to claim 1, characterized in that the profiles comprise a semicircular cross-section.

10. Apparatus according to claim 1, characterized in that the guide devices (LV) are attached to those sides of the electrodes facing toward the conveying path.

11. Apparatus according to claim 10, characterized in that the guide devices (LV) are attached to soluble anodes (A1).

12. Apparatus according to claim 10, characterized in that the guide devices are attached to insoluble anodes (A1).

13. Apparatus according to claim 1, characterized in that the guide devices (LV) are attached to carriers(T) arranged between the conveying path and soluble anodes (A3).

14. Apparatus according to claim 13, characterized in that the carriers (T) are formed by porous plates.

15. Apparatus according to claim 13, characterized in that the carriers (T) are formed by frames over which transmisses cloth or fleece is stretched.

16. An apparatus for electrolytic treatment of planar substrates comprising:

- a treatment cell including at least one upstanding peripheral sidewall defining a cell body having an interior bath cavity, a bottom end and an opposed top, said sidewall including a pair of opposed vertical slots disposed therein and defining a conveying axis extending through the treatment cell, a plurality of upstanding spaced apart guide members disposed in said bath cavity adjacent the conveying axis on opposite sides thereof and arranged to define a plate guide path along the conveying axis, each guide member having a surface thereof facing the conveying axis including a plurality of surface projections thereon, each surface projection having a surface configuration effective to redirect a flow of bath liquid when flowing from the bottom end to the top of the bath cavity to a flow direction including a flow component directed toward the conveying axis, said treatment cell further including a pair of spaced electrodes having a first polarity disposed on opposite sides of the conveying axis in the bath cavity;

- an outer collecting tank surrounding the treatment cell for collecting bath liquid issuing from the treatment cell;

- a conduit fluidly connecting a bottom end of the collecting tank to the bottom end of the bath cavity;

- a pump disposed in said conduit for continuously returning bath liquid from the collecting tank to the bath cavity;

- means for directing returning bath liquid into the bottom end of the bath cavity to provide a vertical flow of the bath liquid from the bottom end to the top of the bath cavity at both sides of the conveying axis; and

- means for contacting a planar substrate with a second polarity opposite said first polarity and for conveying the planar substrate through the treatment cell along the conveying axis.

* * * * *